United States Patent [19]
Katz et al.

[11] Patent Number: 5,897,309
[45] Date of Patent: Apr. 27, 1999

[54] SEQUENTIAL STEP BELT FURNACE WITH INDIVIDUAL CONCENTRIC COOLING ELEMENTS

[75] Inventors: Robert Paul Katz, Wappingers Falls, N.Y.; William Wayne Olah, Grantsboro, N.C.; William Bernice Roberts, Middletown, N.Y.

[73] Assignee: International Business Machines Corporation, Armonk, N.Y.

[21] Appl. No.: 08/408,860

[22] Filed: Mar. 22, 1995

Related U.S. Application Data

[62] Division of application No. 08/218,105, Mar. 25, 1994, Pat. No. 5,421,723.

[51] Int. Cl.⁶ .................................................. F27D 15/02
[52] U.S. Cl. ............................... 432/77; 432/78; 432/85; 62/63
[58] Field of Search ................................ 432/78, 59, 77, 432/85; 62/63

[56] References Cited

U.S. PATENT DOCUMENTS

| | | | |
|---|---|---|---|
| 4,276,603 | 6/1981 | Beck et al. | 364/477 |
| 4,398,700 | 8/1983 | Thome | 266/111 |
| 4,539,824 | 9/1985 | Kuraoka et al. | 62/63 |
| 4,554,437 | 11/1985 | Wagner et al. | 219/388 |
| 4,586,898 | 5/1986 | Orbeck | 432/122 |
| 4,610,886 | 9/1986 | Buller-Colthurst | 426/233 |
| 4,627,244 | 12/1986 | Willhoft | 62/63 |
| 4,627,814 | 12/1986 | Hattori et al. | 432/128 |
| 4,711,989 | 12/1987 | Yu | 219/390 |
| 4,784,069 | 11/1988 | Stark | 110/211 |
| 4,790,749 | 12/1988 | Mauro | 432/59 |
| 4,792,302 | 12/1988 | Baker et al. | 432/59 |
| 4,857,689 | 8/1989 | Lee | 219/10.71 |
| 4,886,954 | 12/1989 | Yu et al. | 219/390 |
| 4,915,624 | 4/1990 | Mittelstadt | 432/59 |
| 4,950,870 | 8/1990 | Mitsuhashi et al. | 219/390 |
| 4,957,432 | 9/1990 | Rachal et al. | 432/59 |
| 4,966,547 | 10/1990 | Okuyama et al. | 432/9 |
| 4,982,347 | 1/1991 | Rackerby et al. | 364/557 |
| 5,373,893 | 12/1994 | Eisenmann et al. | 62/63 |

OTHER PUBLICATIONS

IBM Technical Disclosure Bulletin, vol. 33, No. 1A, p. 308, (Jun. 1990).

Primary Examiner—Teresa Walberg
Assistant Examiner—Jiping Lu
Attorney, Agent, or Firm—Aziz M. Ahsan

[57] ABSTRACT

This invention relates generally to a belt type furnace. More specifically, this invention relates to a belt type furnace that sequentially stops the belt at the vicinity of at least one cooling unit, and where the cooling unit comprises at least two cooling elements. The furnace also allows the cooling of parts in such a way that the part cools uniformly.

23 Claims, 2 Drawing Sheets

SEQUENTIAL STEP BELT FURNACE WITH INDIVIDUAL CONCENTRIC COOLING ELEMENTS

CROSS-REFERENCE TO A RELATED PATENT APPLICATION

This Application is a Divisional Patent Application of U.S. patent application Ser. No. 08/218,105, filed on Mar. 25, 1994, and which has issued as U.S. Pat. No. 5,421,723, on Jun. 6, 1995.

FIELD OF THE INVENTION

This invention relates generally to a belt type furnace. More specifically, this invention relates to a belt type furnace that sequentially stops the belt at the vicinity of at least one cooling unit, and where the cooling unit comprises at least two cooling elements. The furnace also allows the cooling of parts in such a way that the part cools uniformly.

BACKGROUND OF THE INVENTION

For many years the electronics industry has used belt type furnaces for high volume cooling applications. For an application, such as chip join, the operation is characterized by loading many parts on the belt, followed by continuous movement of the belt through the furnace's heating areas to the cooling areas. It is also very important that the furnace provides a uniform temperature across the belt so that each individual part reaches the same temperature during processing. During a typical high volume cooling application, intra-part gradients and short dwell times never becomes a problem, because the parts are small and are easily cooled. For these applications the total cooling system has evolved to a point where it is very reliable and reasonably priced.

U.S. Pat. No. 4,398,700 (Thome) discloses a continuous flow annealing furnace, with cooling chambers that employ mass-acting plenums with uniform distribution of gas within that plenum.

U.S. Pat. No. 4,627,814 (Hattori et al.) discloses a furnace that has various process chambers, each of which is individually separated. Also disclosed are fans that provide uniform cooling of the process chambers.

U. S. Pat. No. 4,792,302 (Baker et al.) discloses a heating system that provides uniform air distribution system to achieve temperature uniformity. It uses an insulating block, which has evenly spaced equal size holes drilled in it to provide the uniform distribution.

U.S. Pat. No. 4,957,432 (Rachal et al.) discloses the heating and cooling from both the ceiling and the floor of a furnace. Also disclosed is the mixing of hot and cold air or gases to provide desired temperature inside the furnace chamber.

U.S. Pat. No. 4,966,547 (Okuyama et al.) discloses a heat treatment method using a zoned tunnel furnace. The furnace has roller conveyer and each of the zones in the furnace walls are provided with electric resistance heating wires. The heaters in each zone are under programmed control, independent of the heaters in the other zones. Similarly, the roller conveyer in each zone can be driven independent of the roller conveyer in the other zones by programmable controllers.

IBM Technical Disclosure Bulletin, entitled "Gas Jet Manifold For Module Cooling In Belt-Type Chip-Joining Furnaces", Vol. 33, No. 1A, Page 308 (June 1990), discloses the cooling of chip-substrate module using cooling gas through an array of nozzles that are a part of a plenum. The plenum has a diffuser through which the cooling gas enters.

The parts or products using conventional belt type furnaces have changed over time. Some of the parts have been getting larger, and it has become increasingly difficult to do the same type of processing on the larger parts, as done by the furnaces known in the art. Because of the thermal mass or thermal weight some of the larger parts resist being cooled quickly. Another factor is that newer and different materials are being used to make these parts and these newer materials require a different cooling regime. These issues are further compounded by the fact that now closer temperature control and lower intra-part gradients are being required by the electronics industry, and this has made the conventional belt furnace only marginally acceptable.

The manufacturers of conventional belt type furnaces have made quite a few upgrades to their furnaces in response to the industrial needs. Some upgrades include providing better and more efficient gas flows. Others have provided improved zone separation. And, still others are providing better cooling in the cool down section. Most of these changes are required because the parts or products are less tolerant to thermal process irregularities and the resultant mechanical stress.

For the larger parts it was observed that when these large parts were run in conventional belt furnaces they cool around the periphery faster than in the center. This is especially true for large and poor thermally conductive parts. It was noticed that this temperature gradient was as large as 50° C. or larger. This non-uniform part cooling with such a high temperature gradient induces thermal stresses throughout the part and exposes the part to potential failure.

Another concern that has also surfaced is achieving minimal dwell times. Large thermal mass, high intra-part thermal conduction and a slow constant moving belt all combine to make short uniform dwells all but impossible. When a part is placed in a conventional cooldown chamber, the edges of the part cool before the center, and the entire part does not fall back to the desired temperature in as short period of time as required which results in longer dwell times.

Another problem that arises with conventional cooling schemes is the high volume of cooling gas or media used. Conventional schemes provide cooling gases to the entire cooling chamber. Basically, a fixed volume of cooling gas is constantly provided to the entire cooling chamber. This is necessary since the position of a given part is not known throughout its travel through the furnace.

For the above-mentioned reasons, processes such as chip join and pin braze on larger products cannot always be processed within specification using the belt type conventional furnaces. And, those parts that are processed, are processed at the full tolerance of the specification.

For example, the chip join process is characterized by two main parameters. The chip join process, is a process where an integrated circuit (I.C.) chip is joined to a substrate or carrier, typically using a plurality of solder balls. First, the part, such as a chip and the substrate, must go from the melting point of the alloy (Mp), i.e., the Mp of the solder balls, to a greater temperature (e.g. over 30° C. past Mp) and then back to Mp. Secondly, this raising and lowering of the temperature for the chip join process must be done in minutes. This has not been a problem for most belt furnaces, as long as the part or product or carrier is in the 50 mm by 50 mm size range. Products or substrates in the 100 mm by 100 mm size range begin to present a problem due to their large thermal mass, making it very difficult to heat to the desired temperature and then cool it to its original temperature in minutes. Furthermore, rapid cooling of these parts or carriers introduces large temperature gradients. These gradients as discussed elsewhere are as large as 50° C. or larger.

The belt furnace of this invention overcomes the above-mentioned and other shortcomings of the conventional belt type furnaces.

BRIEF SUMMARY OF THE INVENTION

In one aspect the invention comprises an apparatus for cooling at least one structure, comprising;
 a) at least one transporting means for securely transporting said at least one structure,
 b) at least one cooling zone in said apparatus, wherein said cooling zone further comprises at least one cooling unit with at least two individual cooling elements,
 c) at least one moving and holding means for moving and holding said at least one transporting means in the area of said at least one cooling zone and holding it there while said at least one structure is being cooled by said at least two cooling elements.

In another aspect the invention comprises an apparatus for cooling at least one structure, comprising;
 a) at least one belt for securely transporting said at least one structure,
 b) at least one cooling zone in said apparatus, wherein said cooling zone further comprises at least one cooling unit with at least two individual cooling elements,
 c) at least one sequential motor for moving and holding said at least one belt in the area of said at least one cooling zone and holding it there while said at least one structure is being cooled to the desired temperature by said at least two cooling elements.

In still another aspect the invention comprises a process for cooling a structure comprising:
 a) moving and holding said structure in the vicinity of a cooling zone,
 b) cooling said structure in said cooling zone, wherein said cooling zone comprises at least one cooling unit having at least two individual cooling elements, said cooling zone cools said structure in such a manner that said substrate has a minimum of thermal gradient, and
 c) moving said part to the next zone after the desired temperature has been reached.

Purposes of the Invention

One purpose of this invention is to provide a belt type furnace to process substrate laminates with a minimum intra-part temperature gradient.

Another purpose of the invention is to provide a sequential drive belt system that transports the parts and stops them under multiple, individually controlled concentric cooling elements.

Still another purpose of this invention is to allow the parts to be cooled to a specified amount in each successive cooling zone until the desired temperature is reached in the last cooling zone.

Yet another purpose of this invention is the time the belt dwells in each cooling zone and the transit time be adjustable.

Still yet another purpose of this invention is to provide means for the cooling elements to provide non-uniform cooling to the part.

Yet another purpose of this invention is to provide means for the cooling elements to provide uniform cooling to the part.

Still yet another purpose of this invention is to increase the efficiency of cooling and reduce the cooling gas volume required to cool a part.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention may be best understood by the description which follows, taken in conjunction with the accompanying drawings in which:

DETAILED DESCRIPTION OF THE INVENTION

This invention primarily relates to a multi-zone belt furnace that utilizes a sequential drive belt system and a plurality of cooling elements in each zone.

The preferred cooling system of this invention contains several successive cooling chambers or zones, each of which are composed of multiple, concentric, individually controlled gas impingement cooling jets, coupled with a fast moving sequential belt to transport the parts. The belt moves a part into the center of a cooling zone, stops for a predetermined programmable period of time, and subsequently indexes the part to the next zone, where the process repeats until the part exits the furnace.

The implementation of such a cooling system virtually eliminates non-uniform part cooling. When the part is stopped in the center of the cooling zone, the individually controlled concentric cooling jets are adjusted to provide a greater volume of cooling gas to the center of the part, where the tendency is greatest to remain hot, and a smaller volume of cooling gas to the periphery of the part, where the tendency is to cool comparatively quickly. By using a fast moving sequential drive belt to transport the parts, the potential for intra-part heat conduction is minimized, and temperature uniformity across the part is maintained. Thus, by providing distinctly non-uniform cooling gas impingement, the natural tendency of a parts' thermal properties can be overcome, and the part can be cooled uniformly.

Since there is little or no intra-part gradients, there is little or no thermal stress within the part, and failures and damage from thermal stresses are greatly reduced.

Furthermore, because the part is cooled uniformly, no area of the part lags the rest of the part in cooling. Therefore, the dwell time is the same for the entire part, and the dwell time is reduced significantly.

Another benefit or advantage of this inventive cooling system is that it requires a smaller volume of cooling gas than is required in conventional systems. This is due to the fact that only enough gas to cool the parts is used, and there is no need to provide gas to the inter-zone spaces in the cooldown section or the entire cooldown chamber as seen in conventional cooling schemes.

Figure 1:
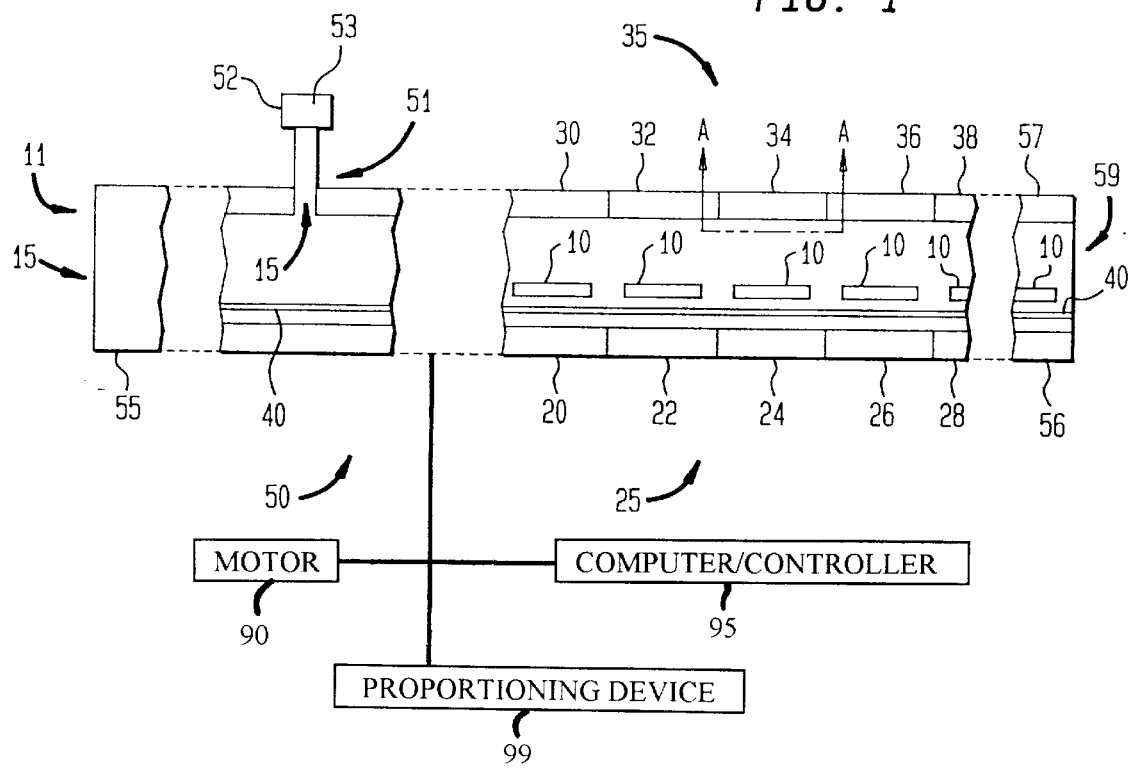
FIG. 1, is a schematic cross-sectional view of a preferred embodiment of the cooling section of a furnace of this invention.

Furthermore, since the position of a given part is predictable and known, it is also possible to enable and disable portions of the cooling chamber as needed, as a part travels through the cooling chambers. Referring to FIG. 1, disclosed according to the invention is a sequential belt type furnace 50, having a heating portion 55, an after-burner portion 51, and at least one cooling zone or chamber. The heating portion 55, could be any conventional furnace or the inventive furnace as disclosed by Olah, et al., in U.S. Pat. application Ser. No. 07/920,948, the disclosure of which is incorporated herein by reference, and which is assigned to the assignee of the instant patent application. The cooling zone could be at least one lower cooling zone or chamber 25, and/or at least one upper cooling chamber or zone 35, or a sidewall type of a cooling chamber or zone (not shown). There are means (not shown) that move at least one belt 40, through the furnace cooling area in a sequential manner. One or more parts or products 10, such as an I. C. chip or substrate or module, to name a few, that have to be cooled down are on the upper surface of the belt 40. The lower cooling zone 25, typically has one or more individual lower cooling units, such as individual lower cooling units 20, 22, 24, 26 and 28. The lower cooling zone 25, could also extend to an individual lower cooling unit 56. Similarly, the upper cooling zone 35, typically has one or more individual upper cooling units, such as individual upper cooling units 30, 32, 34, 36 and 38. The upper cooling zone 35, could also extend to an individual upper cooling unit 57.

Each of the individual cooling units, whether upper, lower or side cooling units, must have preferably at least two concentric cooling elements. Each zone temperature could be determined by a single thermal sensor, such as a single thermocouple (not shown) in each cooling element, or with the use of a single zone thermal sensor. Of course one could use a proportioning device to further adjust the individual zone elements. This would allow the cooling media or cooling power to be proportionately distributed to each cooling element in predetermined amounts.

The belt 40, sequentially moves the parts or products 10, through the various cooling zones in a manner such that at least a portion of the part or product 10, is stationary or stopped in the vicinity of an individual cooling unit.

The furnace 50, typically has a gas 15, that flows along the path of the parts. It is preferable that the furnace 50, has an afterburner portion 51, having an afterburner 53, with an igniting media 52, to burn off the gas 15. The igniting media 52, is typically selected from a group comprising one or more flammable gases, such as, hydrogen, propane, natural gas, etc.

This gas 15, can be used to avoid contamination of the walls and other surfaces of the furnace 50, by introducing the gas 15, at the load end 11, of the furnace 50, and allowing it to move towards the last heating zone. The gas 15, can be directed to go into an afterburner 53, which has an igniting media 52, to consume the gas 15, and the other contaminants that may have flowed with it inside the afterburner 53. To keep these volatiles from condensing in the house exhaust system, an afterburner 53, can be added to the furnace to incinerate any residual volatiles.

FIG. 1, also shows the furnace 50, having at least one sequential or variable speed motor 90, a computer or a temperature controlled 95, and a proportioning device 99.

Figure 2:
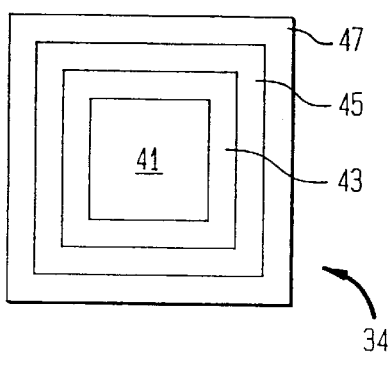
FIG. 2, is a schematic view showing one embodiment of section A—A, from FIG. 1.

FIG. 2, shows a schematic view of one embodiment taken along section A—A, in FIG. 1, showing a typical individual cooling unit made according to the teaching of this invention. The individual upper cooling unit 34, shown as an example, has cooling elements 41, 43, 45 and 47, which are preferably concentric. A person skilled in the art could of course put more or less number of individual cooling elements. These individual cooling elements 41, 43, 45 and 47, could have similar cooling output or different thermal output profile. This would of course depend on the particular application. The only requirement for the cooling elements 41, 43, 45 and 47, is that they provide a cooling profile that cools the part or product, so that the intra-part thermal gradient is minimized.

Figure 3:
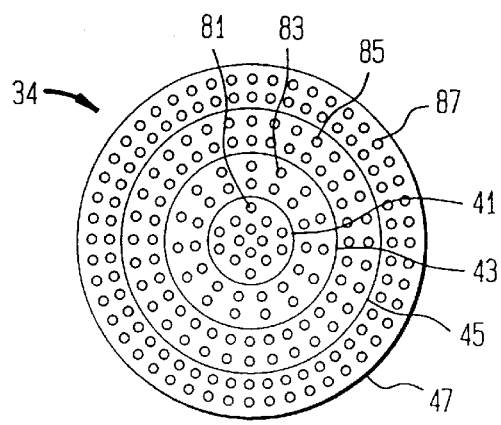
FIG. 3, is a schematic view showing another embodiment of section A—A, from FIG. 1.

FIG. 3, shows a schematic view of another embodiment taken along section A—A, in FIG. 1, showing an individual cooling unit made according to the teaching of this invention. The individual upper cooling unit 34, shown as an example, has cooling elements 41, 43, 45 and 47, which are preferably concentric. A person skilled in the art could of course put more or less number of individual cooling elements. These individual cooling elements 41, 43, 45 and 47, could have similar cooling output or different thermal output profile. This would of course depend on the particular application. The only requirement for the cooling elements 41, 43, 45 and 47, is that they provide a cooling profile that cools the part or product, so that the intra-part thermal gradient is minimized. Each of these individual cooling elements 41, 43, 45 and 47, have a plurality of holes or openings 81, 83, 85 and 87, respectively, to allow for the flow of the cooling fluid or media. These holes or openings 81, 83, 85 and 87, could all be of the same size or could be or a different size. The physical shape, size and configuration of these holes or openings 81, 83, 85 and 87, of course would depend on the desired volume of cooling fluid or media flow or the desired cooling profile from one or more of the corresponding individual cooling elements.

Similarly, the volume of cooling fluid or media or gases flowing through the individual cooling elements 41, 43, 45 and 47, would depend on the temperature profile that is desired.

It is preferred that the cooling unit 34, has circular holes or openings, but other hole configurations, such as elliptical, rectangular, triangular, polygonal or some other odd shape would also be acceptable. It is also to be understood that instead of holes or openings, one could use some other type of configuration for the fluid flow, such as channels or vanes, to name few.

It has been found that the belt furnace 50, described in this invention processes large parts, such as 100 mm by 100 mm or larger parts, through the whole cooling cycle, i.e., through the initial or first cooling zone to the final cooling zone, with less than a 10° C. temperature variation across the whole part.

The problem of high thermal gradients occurring when the part 10, transits through the various cooling zones, has been greatly reduced by the adoption of the furnace 50, of this invention. This is due to the fact that the part 10, can be similarly "cooled" using the cooling elements 41, 43, 45 and 47, as it exits, after the part 10, has been processed to the maximum specification requirements. This cooling is provided by insuring that the subsequent cooling zones are at a lower temperature than the preceding cooling zone, and that the part 10, sees a uniform thermal gradient as it goes from one zone to another riding on the belt 40.

The peripheral cooling problem of large parts using a conventional cooling furnace has also been solved by the inventive furnace 50. This is accomplished through the use of the sequential drive system and the revolutionary cooling unit design. As one can see in FIG. 1, that each cooling zone in the furnace 50, has multiple individually controlled cooling elements. When the part 10, enters the cooling zone more "cold" flow is directed to the center of the part 10, and less to the periphery. The element and cooling media temperatures can be adjusted to reduce the intra-part thermal gradients while the part 10, is being cooled. Each successive zone is adjusted to continue lowering the part temperature or reducing the part temperature without thermal gradients.

Another problem solved by the inventive furnace 50, is the long dwell times that the conventional belt type furnaces were yielding. Dwell time as used herein is the time it takes for a part that is being cooled to go from a given temperature to a higher temperature and then return back to the original or "cool down" temperature. All conventional belt furnaces use a slow, constantly moving belt for product transport. Using constant moving conventional belt furnace, the part spends a significant period partially in the heating zone and partially in the cooling zone. The front of the part is being cooled at the same time that the back of the part is being heated. This heating and cooling causes thermal conduction within the part and large thermal gradients are produced that induce thermal stress to the part. With the furnace of this invention the part is either heated or uniformly cooled during the thermal cycling process and the whole part sees the same temperature. Thus, the temperature transition of the part that defines the dwell takes a very short time.

The problem of thermal stress due to the continuous movement of the part in a conventional furnace has also been greatly reduced by the inventive furnace 50, due to the use of a sequential drive belt 40. The belt 40, stops with the part 10, in the center of the cooling zone. The cooling is provided by one or more of the upper, lower or side cooling units having two or more cooling elements. After a prescribed period of time, the belt 40, accelerates, and then decelerates, and places the part 10, in the center of the next cooling zone. Of course, the transit and soak times are programmable, using a computer or a controller. The program for the transit from one zone to another zone should be such that the part 10, never reaches a constant velocity. For example, for a 15 second programmed transit time, the part should be accelerated for the first 7.5 seconds, and then decelerated for the next 7.5 seconds. This presents the smoothest possible mechanical transfer of the part 10, from one zone to another.

The problem of non-uniform cooling of a part has also been solved by this inventive furnace 50. In the past when uniform cooling flux was applied, the part would cool faster around the periphery than in the center. This condition was observed not only for a conventional belt furnace, but also for a batch oven. As with the slow moving belt, this was another condition that contributed to intra-part thermal gradients that induce stress to the part. The furnace 50, with its sequential belt 40, provides a unique solution to the intra-part thermal gradients problem. Because the sequential belt 40, positions the part 10, in the center of each cooling zone, one knows where the part is. This allows the design of cooling elements that direct more cold flow to the center of the part than to the periphery. The cooling zone typically contains concentric cooling elements. The individual cooling elements in each zone can be adjusted to provide the correct cold flow across the part for uniform part cooling while in that zone. Similarly, the individual cooling elements can also be adjusted to provide a unique or different thermal profile.

As one can see, the furnace of this invention provides a substantially reduced temperature gradient during cooling of a part, and allows dwell times half that of a conventional belt furnace. This new furnace removes the thermal mass limits that parts had run into with regard to many thermal processes, such as, chip joining and pin brazing.

This inventive furnace could be modified so that a plurality of cooling zones remain at the same temperature to allow a part or product to experience a different temperature cooling profile. Similarly, the cooling zones could be modified to provide the desired temperature cooling profile.

Conventional cooling systems could also be attached at the end of the last cooling zone 59, to provide additional cooling of the part 10. Similarly, other processing equipments can be easily secured-or attached to the end of the last cooling zone 59, for the further processing of the part 10.

This inventive furnace can be used for a variety of processes, for example, pin brazing process, chip join process, to name a few.

Means for moving the sequential belt 40, could also be modified so that the belt 40, could move in a reversible or similar such manner. Similarly, the furnace 50, could have one or more sequential belts 40, and these sequential belts 40, could be on the same or different planes.

The furnace 50, has been illustrated with an upper cooling zone 35, and a lower cooling zone 25, but the furnace could work with just one of the cooling zones. Similarly, the inventive furnace 50, could also have individual cooling units on the side walls of the furnace or at other appropriate locations.

The cooling fluid or media that is used to cool the parts could be a gas or a liquid. The cooling fluid or media could be typically selected from a group comprising one or more gases, such as, hydrogen, nitrogen, oxygen, helium, air, carbon dioxide, carbon monoxide, to name a few. Furthermore, the cooling elements may possess the ability to actively cool (or heat) the cooling media, (eg. cold junction, active refrigeration).

As shown in FIG. 1, the furnace 50, has is at least one sequential motor 90, and a computer or a controller 95.

EXAMPLE

The following example is intended to further illustrate the invention and is not intended to limit the scope of the invention in any manner.

The operation was as follows: A system similar to one shown in FIG. 1, was used where the sequential drive belt 40, transported a part 10, using a sequential drive motor, into the first cooling zone. In that zone, the temperature of the part was lowered by 40° C. After a set period of time, the part was then transported to the second cooling zone where the temperature was again lowered by another 40° C. In each zone this process of lowering the temperature of the part by a set amount continued, until the last cooling zone was reached where the part temperature was near ambient. Each of the cooling zones of course had cooling units that had a plurality of cooling elements. Throughout this temperature lowering process the intra-part gradients rarely exceed 10° C. After a pre-set time after the part had reached the desired temperature the part was moved out of the last cooling zone.

The belt moved the product in 15 seconds from the center of one zone to the center of the next. During this time the belt was accelerated for 7.5 seconds and then decelerated for the next 7.5 seconds. This allowed the part to be properly situated for the cooling process. The belt then stopped for 90 seconds. The move, stop, cool and move process was sufficient to bring each of the parts or substrates in their own cooling zone and then to uniformly cool the part by 40° C. Of course for a different application a different move, stop, cool, move process would be employed. The time the part was between the different zones has been greatly reduced and so is the high thermal gradients and stress. This has also allowed dwell times to improve to a point that 2 minutes and less of dwell times have been achieved.

Figure 4:
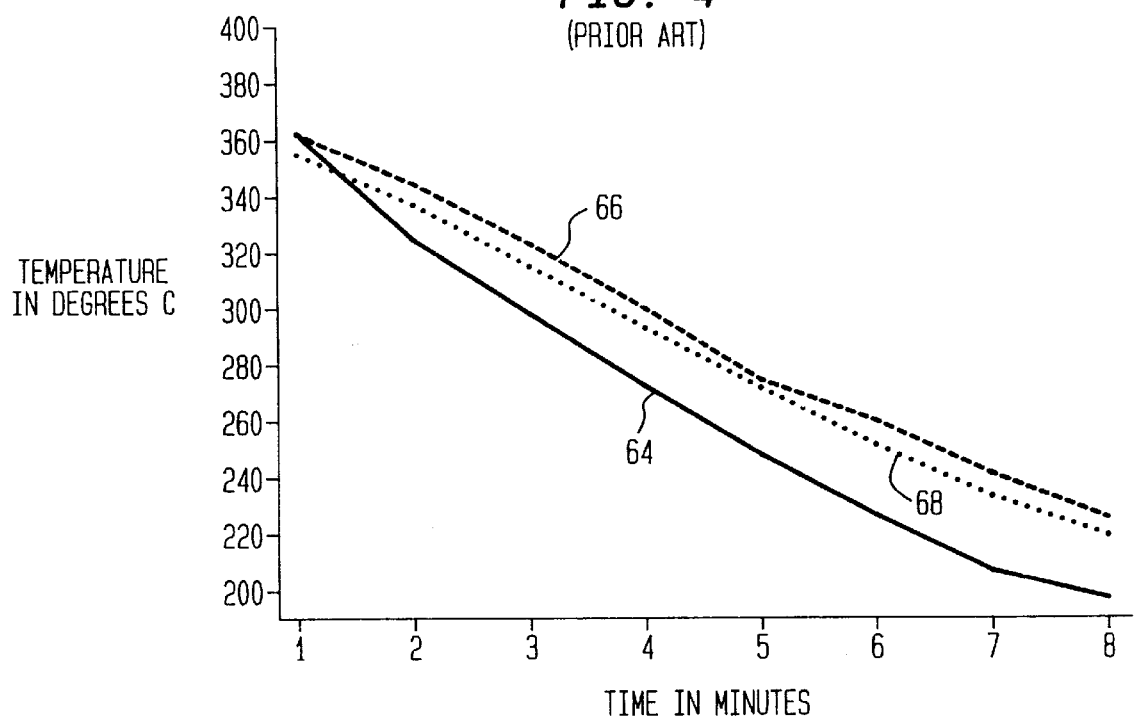
FIG. 4, is a graph showing a typical cooling profile of a substrate using a prior art convention belt type furnace.
Figure 5:
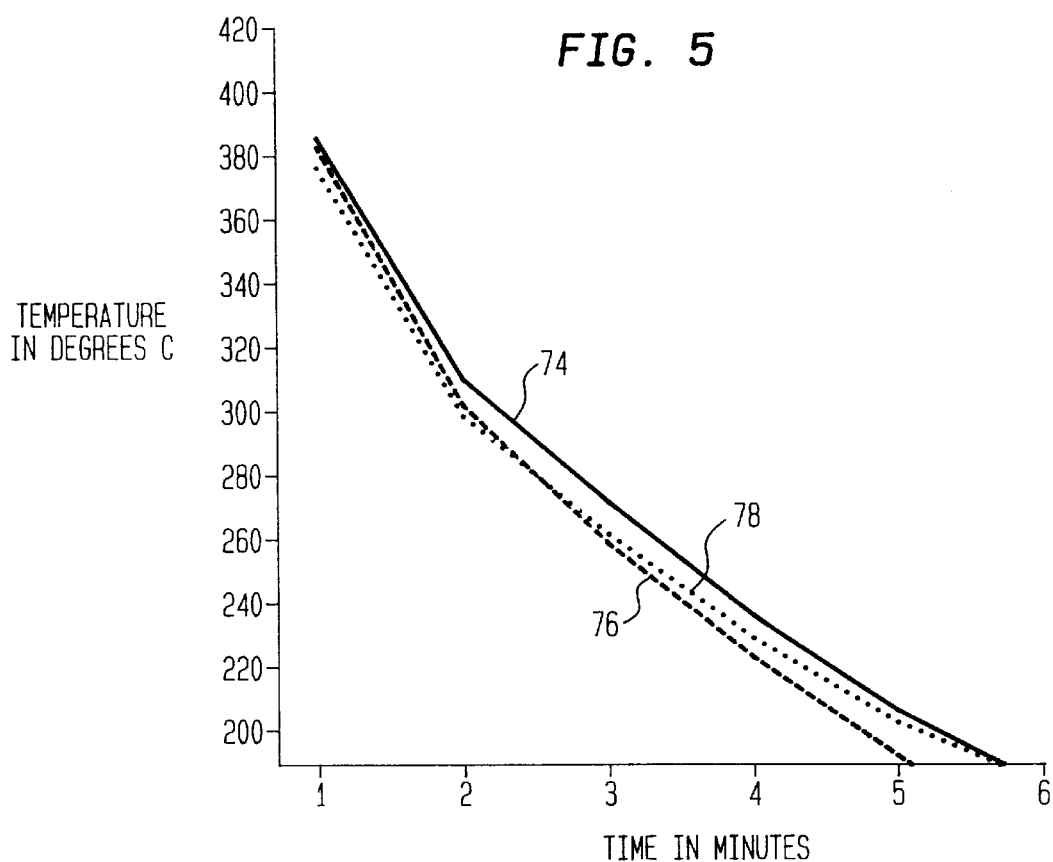
FIG. 5, is a graph showing a typical cooling profile of a substrate using a belt type furnace made according to the teachings of this invention.

FIGS. 4 and 5, show the difference for a standard cooling profile. FIG. 4, is a thermal cooling profile that was obtained using a conventional belt furnace. The part was cooled rapidly in the conventional belt furnace and then allowed to normalize. Line 66, plots the center temperature for the part, while the front end temperature was plotted by line 64, and the trailing end temperature was plotted by line 68. As one can see, the maximum thermal gradient at any given time between the front of the part and the center of the part was in most cases over 30° C. As a matter of fact after 8 minutes the front of the part had only cooled down to approximately 200° C. from 360° C.

When a similar part was processed using the inventive furnace the intra-part thermal gradient for the part at any given time was a maximum of 10° C., as can be clearly seen in FIG. 5. The center temperature of the part during process is shown by line 76, while lines 74 and 78, plots the temperature at the front and trailing edge, respectively, of the part. FIG. 5, clearly shows that the temperatures across the part were very uniform which of course produced much less thermal stress in the part. This simultaneously cooling of the entire part produces a much more reliable part as the thermal stresses in the part have been greatly reduced. As a matter of fact in less than 6 minutes the front of the part had cooled down to below 200° C. from the initial 380° C.

It was also noticed that the cooling profile for the part using the inventive cooling furnace, as shown in FIG. 5, was very different than the one obtained from using the prior art cooling furnace, which is shown in FIG. 4. As a matter of fact the hardest portion to cool, i.e., the center portion, is now the coolest portion of the part as clearly shown by line 76, in FIG. 5.

While the present invention has been particularly described, in conjunction with a specific preferred embodiment, it is evident that many alternatives, modifications and variations will be apparent. to those skilled in the art in light of the foregoing description. It is therefore contemplated that the appended claims will embrace any such alternatives, modifications and variations as falling within the true scope and spirit of the present invention.

What is claimed is:

1. A process for cooling at least one structure comprising the steps of:
    a) moving and holding said structure in a vicinity of at least one cooling zone,
    b) cooling said structure in said cooling zone, wherein said cooling zone comprises at least one individual cooling unit having at least two individual cooling elements, and wherein a cross-sectional area of one of said at least two individual cooling elements is larger than a cross-sectional area of an other of said at least two individual cooling elements, and wherein said at least two individual cooling elements provide cooling to said structure in such a manner that said structure has a minimum of thermal gradient, and
    c) moving said structure to a next zone after a desired temperature has been reached.

2. The process of claim 1, wherein said at least one cooling unit uniformly cools said structure.

3. The process of claim 1, wherein said at least one cooling unit non-uniformly cools said structure.

4. The process of claim 1, wherein a computer controls a cooling profile for said at least two individual cooling elements.

5. The process of claim 1, wherein said at least two individual cooling elements are concentric.

6. The process of claim 1, wherein at least one sequential motor provides said moving and holding to said at least one structure.

7. The process of claim 1, wherein said moving is provided by at least one belt.

8. The process of claim 7, wherein at least one of said at least one cooling zone is above said at least one belt.

9. The process of claim 7, wherein at least one of said at least one cooling zone is below said at least one belt.

10. The process of claim 7, wherein during said moving said at least one belt is moved in steps so that at least a portion of said at least one belt stops in the vicinity of said at least one cooling unit.

11. The process of claim 7, wherein during said moving at least one means is provided for accelerating and decelerating said at least one belt.

12. The process of claim 7, wherein said at least one belt is accelerated for a portion of a time and said belt is decelerated for a portion of a time.

13. The process of claim 7, wherein said at least one belt is accelerated for half a time and said belt is decelerated for half a time.

14. The process of claim 7, wherein a computer controls said moving of said at least one belt.

15. The process of claim 1, wherein said next zone has at least one afterburner.

16. The process of claim 15, wherein said at least one afterburner has at least one igniting media.

17. The process of claim 16, wherein said igniting media is at least one flammable gas.

18. The process of claim 1, wherein said at least two individual cooling elements provide uniform cooling to said at least one structure.

19. The process of claim 1, wherein said at least two individual cooling elements provide non-uniform cooling to said at least one structure.

20. The process of claim 1, wherein a computer controls said step of moving and holding said at least one structure.

21. The process of claim 1, wherein at least one proportioning device proportionally distributes a cooling media to said at least two cooling elements.

22. The process of claim 1, wherein at least one cooling media flows through said at least two cooling elements, and wherein a flow rate of said at least one cooling media through at least one cooling element is different.

23. The process of claim 1, wherein at least one cooling media flows through said at least two cooling elements, and wherein a flow rate of said at least one cooling media through at least two cooling elements is the same.

* * * * *